(12) United States Patent
Gau et al.

(10) Patent No.: US 6,361,909 B1
(45) Date of Patent: Mar. 26, 2002

(54) ILLUMINATION APERTURE FILTER DESIGN USING SUPERPOSITION

(75) Inventors: Tsai-Sheng Gau, Hsinchu; Chin-Chiu Hsia, Taipei, both of (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/455,353

(22) Filed: Dec. 6, 1999

(51) Int. Cl.[7] ................................................. G03F 7/20
(52) U.S. Cl. ............................ 430/30; 430/5; 430/396; 355/71
(58) Field of Search .............................. 430/30, 396, 5; 355/71

(56) References Cited

U.S. PATENT DOCUMENTS

| | | | |
|---|---|---|---|
| 3,969,017 A | * 7/1976 | Dammann | 350/162 |
| 5,392,094 A | 2/1995 | Kudo | 355/67 |
| 5,447,810 A | * 9/1995 | Chen et al. | 430/5 |
| 5,610,684 A | 3/1997 | Shiraishi | 355/55 |
| 5,663,785 A | 9/1997 | Kirk et al. | 355/71 |
| 5,691,803 A | 11/1997 | Song et al. | 355/55 |
| 5,863,712 A | * 1/1999 | Von Bunau et al. | 430/396 |
| 6,015,644 A | * 1/2000 | Cirelli et al. | 430/30 |

* cited by examiner

Primary Examiner—Mark F. Huff
Assistant Examiner—Nicole Barreca
(74) Attorney, Agent, or Firm—George O. Saile; Stephen B. Ackerman

(57) ABSTRACT

A design method, based on the principle of superposition, is presented for complex apertures used to form a filter for condenser lens illumination in an optical reduction system. The method is relatively simple to implement and achieves near optimum results without the need to perform long and error prone calculations. Both OPE and DOF are simultaneously optimized over a wide range of duty ratios.

20 Claims, 5 Drawing Sheets

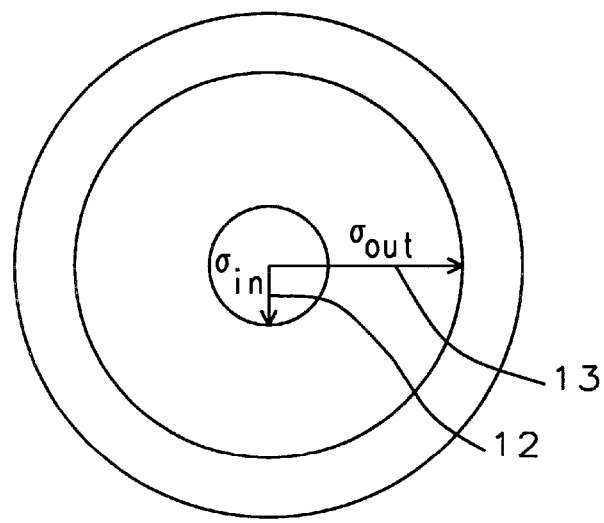
*FIG. 1a - Prior Art*
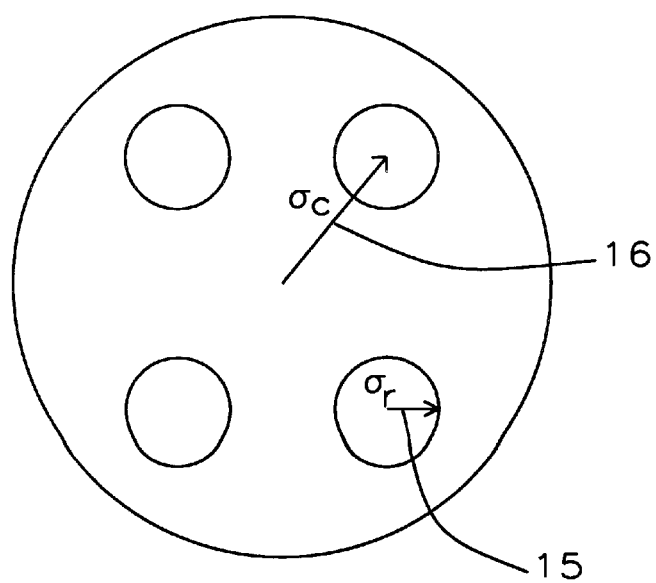
*FIG. 1b - Prior Art*

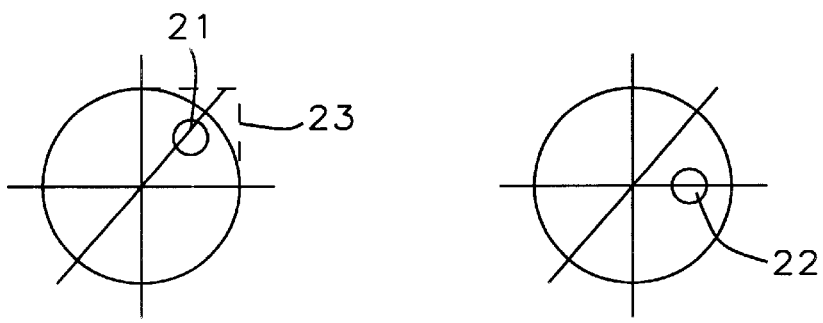
FIG. 2a – Prior Art   FIG. 2b – Prior Art
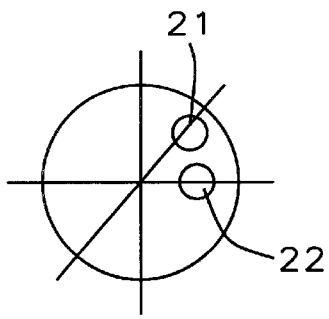
FIG. 3
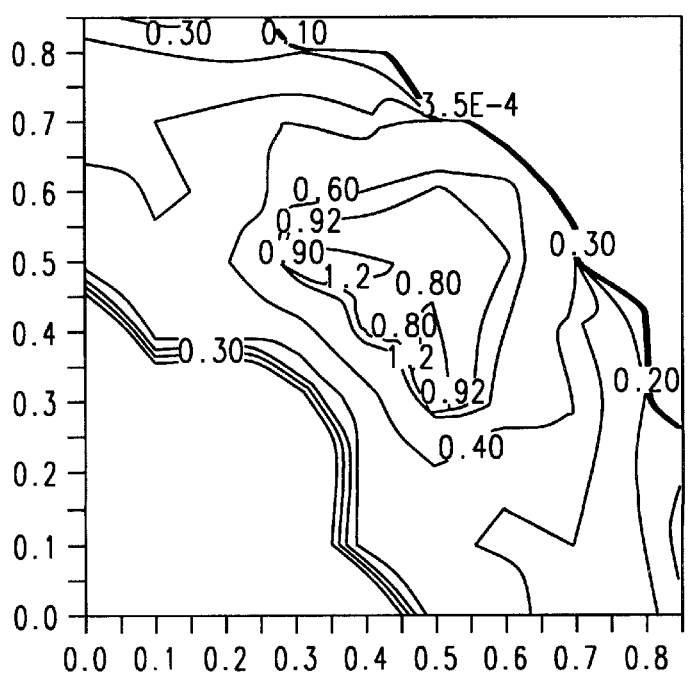
FIG. 4

ILLUMINATION APERTURE FILTER DESIGN USING SUPERPOSITION

FIELD OF THE INVENTION

The invention relates to the general field of photolithography with particular application to improving both depth of focus and minimizing optical proximity effects.

BACKGROUND OF THE INVENTION

Since the birth of the semiconductor industry, photolithography has been used for forming the various components that make up integrated circuits. The continued increase in the density of components that can be placed on a chip has been largely due to advances in photolithography associated with using radiation of ever decreasing wavelengths. As long as the minimum size (critical dimension or CD) of the components was greater than the wavelength of the radiation being used to expose the photoresist, advances in the art did not require any changes in the masks and optical systems used other than to reduce the sizes of the components.

Inevitably, a time came when the critical dimensions got to be less than about half the wavelength of the radiation being used, so radiation of lower wavelength had to be substituted. Eventually, critical dimensions reached, and then went below, the lower limit of optical lithography where conventional optics and resists can still be used (180 nm lines printed from a 248 nm source). Although it has been demonstrated that next generation technology, including X-ray lithography, EUV, ion beam and electron beam, are capable of producing patterns whose critical dimension is one or two orders of magnitude less than that, cost considerations have continued to drive conventional lithography to seek ways to image sub-optical critical dimensions while still using optical techniques.

When the wavelength of the imaging radiation gets to be greater than the CD, the effects of diffraction, though always present, become prominent enough to introduce noticeable distortions into the images projected relative to their original shapes on the imaging mask. These distortions are particularly sensitive to the distances between the various features in the pattern and are therefore referred to as 'proximity effects'. One effective way to deal with these has been to introduce distortions, known as serifs, into the original imaging pattern that compensate for the distortions that are introduced by the diffraction process.

Another problem associated with photolithography at wavelengths close to the critical dimensions is depth of focus (DOF). In particular, when the DOF is less than the thickness of the resist being exposed, image sharpness will be lost. If light rays had no width, they would focus in a plane that was infinitely thin. In practice, because of diffraction effects, the best that can be achieved is a blur circle. As long as rays from the same point on the object are within the blur circle, they are considered to be in focus.

When resolution is not a problem, DOF can be increased by restricting the incoming light to the center of the lens. This then reduces the angle of the light cone so that focused rays travel further before leaving the blur circle. When resolution is also a consideration, this solution is no longer acceptable. The reason for this is as follows:

According to Abbe's theory of image formation, any optical image is made up of two components—undiffracted light (zero order diffraction maximum), which provides overall illumination, and diffracted light (higher order diffraction maxima), which carry the information. The higher the order of the diffraction maxima that contribute to the formation of the image, the better the quality of the image. The more the lens is stopped down the more the higher order maxima are excluded, so the poorer the image quality One way to increase DOF without having to forego contributions from the higher order diffraction maxima is to use off-axis illumination (OAI). Two examples of filters placed in front of the condenser lens, in order to achieve OAI, are shown in FIGS. 1a and 1b. FIG. 1a is an example of an annular aperture while FIG. 1b illustrates a quadrupole aperture. In both cases, the only light that is allowed to enter the system does so at an oblique angle. This narrows the cone of illumination, thereby increasing DOF, while at the same time bringing more of the higher order diffraction maxima close to the center of illumination.

DOF for any particular pattern that is being imaged is, in addition to the above considerations, affected by the relative amounts of dark and light areas in that pattern. This is to be expected since diffraction occurs only at boundaries between light and dark areas, so the more boundaries the more diffraction. This characteristic of the pattern is conveniently expressed as a duty ratio which is defined as total clear area: total dark area.

The above overview of the relationship between DOF, CD, and duty ratio is greatly simplified. In practice, the exact details of how the OAI is delivered to the system are of great importance. For example, it has been found that an annular stop (as in FIG. 1a), which is the simplest way to generate OAI, while helping to reduce the CD, is relatively ineffective when it comes to increasing DOF. A more effective type of OAI is the quadrupole design as illustrated in FIG. 1b. Instead of a continuous annulus, four individual apertures are arranged in the four quadrants of the mask.

Although, as just indicated, the quadrupole arrangement gives better DOF than the annular geometry, optimizing for CD alone can lead to significant loss of DOF, and vice versa, so good aperture design requires optimization of both these quantities at the same time. In early quadrupole designs the apertures were given a circular shape. Later, a square shape was found to be superior and is commercially available as the shrinc system. Most recently, quadrupole apertures have been custom designed for the particular imaging system being used. In the prior art, such designs involve highly complicated calculations based on the inner and outer radii of the annular aperture (12 and 13 in FIG. 1a) or the location and radius of each quadrupole aperture (15 and 16 in FIG. 1b). In all cases the range of possible duty ratios must also be taken into account.

The present invention describes a simple method for achieving near optimum aperture designs without the need to perform long and error prone calculations.

A routine search of the prior art failed to uncover any references that described an aperture design method similar to that of the present invention. Several references of interest were, however, found. For example, Shiraishi (U.S. Pat. No. 5,610,684) shows an exposure system with an optical correction plate. Song et al. (U.S. Pat. No. 5,691,803) show a combined quadrupole and annular illumination system. Kirk et al. (U.S. Pat. No. 5,663,785) show a modified pupil filter that provides a spinning diffraction filter placed in a stepper to provide annular illumination on a time averaged basis while Kudo (U.S. Pat. No. 5,392,094) discusses a parallel beam optical system using superposition.

SUMMARY OF THE INVENTION

It has been an object of the present invention to provide an optical system capable of operating in the deep UV range with both high resolution and long depth of focus.

Another object of the invention has been to provide a method to design an aperture (to be used in a quadrupole configuration) for illuminating a condenser lens whereby high resolution and long depth of focus are achieved.

A further object of the invention has been that said aperture design be effective over a wide range of duty ratios of the patterns being imaged.

These objects have been achieved by applying the principle of superposition to the design methodology. Using either simulation or experimentation, separate designs for optimizing CD and DOF are generated and then superimposed to provide the final design. The method is relatively simple to implement and achieves near optimum results without the need to perform long and error prone calculations. Both CD and DOF are simultaneously optimized over a wide range of duty ratios.

BRIEF DESCRIPTION OF THE DRAWINGS

FIGS. 1a and 1b illustrate prior art aperture designs that are annular and quadrupolar respectively.

FIGS. 2a and 2b show two possible positions for a single off-axis aperture.

FIG. 3 shows a filter in which the designs of FIGS. 2a and 2b have been superimposed.

FIG. 4 is a contour map showing DOF values as a function of where a small diameter aperture is placed within the first quadrant of the filter mask.

DESCRIPTION OF THE PREFERRED EMBODIMENTS

All apertures described below are intended for incorporation in a quadrupole design. For purposes of simplification, only one of the four apertures (the one located in the first quadrant of an opaque disk) may be described in any detail. The filters themselves had diameters ranging from about 1 to 50 cm. The process is suitable for duty ratios in the range 1:N, where N≧1, while the wavelength range in question is between about 90 and 365 nm.

We begin by returning briefly to FIGS. 2a and 2b. As discussed above, each of the apertures shown in these figures would be expected, in the general case, to give different results for both DOF and CD. Thus, a plot can be made of DOF or CD as a function of just where a single aperture (of negligible diameter) is located within the square defined by the principal axes and broken line 23 (FIG. 2a). Examples of such plots (obtained by simulation in this case but which could also have been obtained through experimentation) are FIG. 4 (for DOF) and FIG. 5 (for CD).

The principle of superposition states that if two (or more in the general case) apertures are superimposed on the same filter then the DOF (or CD) that results will have a value somewhere between those obtained for them acting separately. Thus, in a real example where the aperture was located as in FIG. 2a the DOF was 1.4 microns while it was 0.36 microns when the aperture was located as in FIG. 2b. The DOF when these two apertures were superimposed, as shown in FIG. 3, was 0.74 microns, in accordance with the principle of superposition. The combined aperture guarantees the DOF to be no less than two originals.

The gist of the invention is that we can apply the superposition principle to aperture design, resulting in a significant simplification of the process. As noted earlier, traditional methods for aperture design require detailed calculations based on detailed information concerning the shapes and positions of the various apertures and simultaneous optimization for both DOF and CD was very difficult or impossible.

In the present invention, the DOF and CD plots are separately applied to aperture design and then superimposed which, by virtue of the superposition principle, automatically gives rise to a configuration that is close to optimum for both quantities.

Referring now to FIG. 4, which is a plot of DOF as a function of aperture position (0.18 micron lines having a duty ratio of 1:1.3), we see a region where the DOF is between 0.8 and 1.2, with rapid falloff elsewhere. Thus an aperture that just exposes this region on the disk (together with its counterparts in the other three quadrants) will generate an optimum DOF. This is reflected in FIG. 6 where an aperture compounded of a circle A and two squares B is seen to be exposing the appropriate region.

Figure 5:
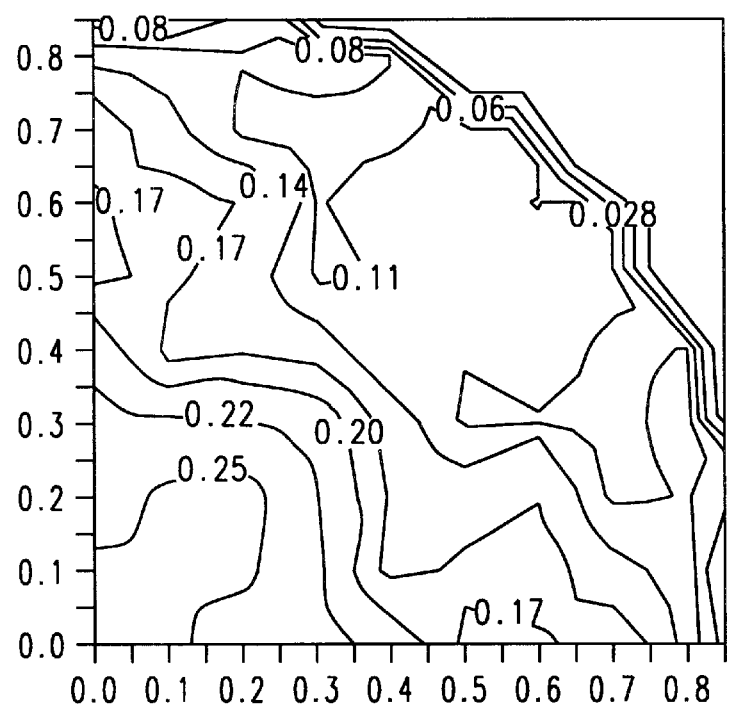
FIG. 5 is a contour map showing CD values as a function of where a small diameter aperture is placed within the first quadrant of the filter mask.

Similarly, in FIG. 5, in can be seen that maximum CD correlates with two main areas. The reason for seeking areas of maximum CD will be discussed below. These two areas are one in the vicinity of the axis of the disk where the CD is 0.20–0.25 and a pair of local maxima near both X and Y axes where the CD is 0.17. This information was used to design the aperture seen in FIG. 8 with circle B corresponding to 0.20–0.25 maximum and squares A corresponding to the 0.17 maxima.

Figure 6:
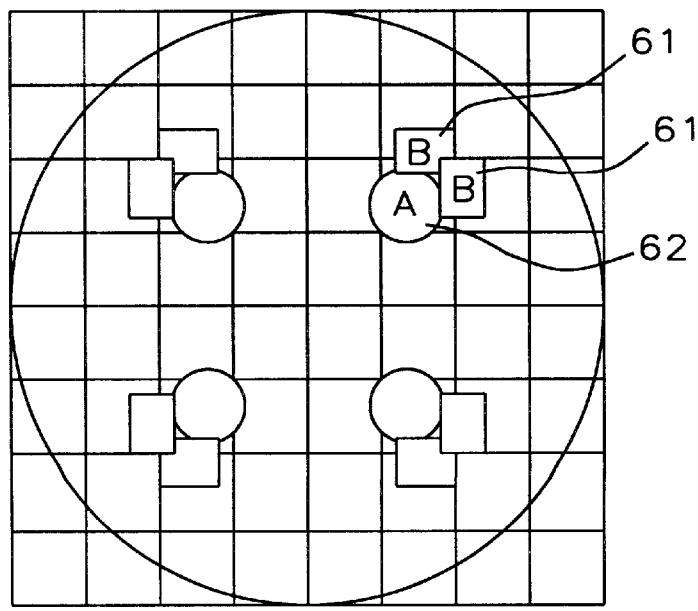
FIG. 6 is an aperture, compounded of a circle and two squares, based on the data seen in FIG. 4.
Figure 7:
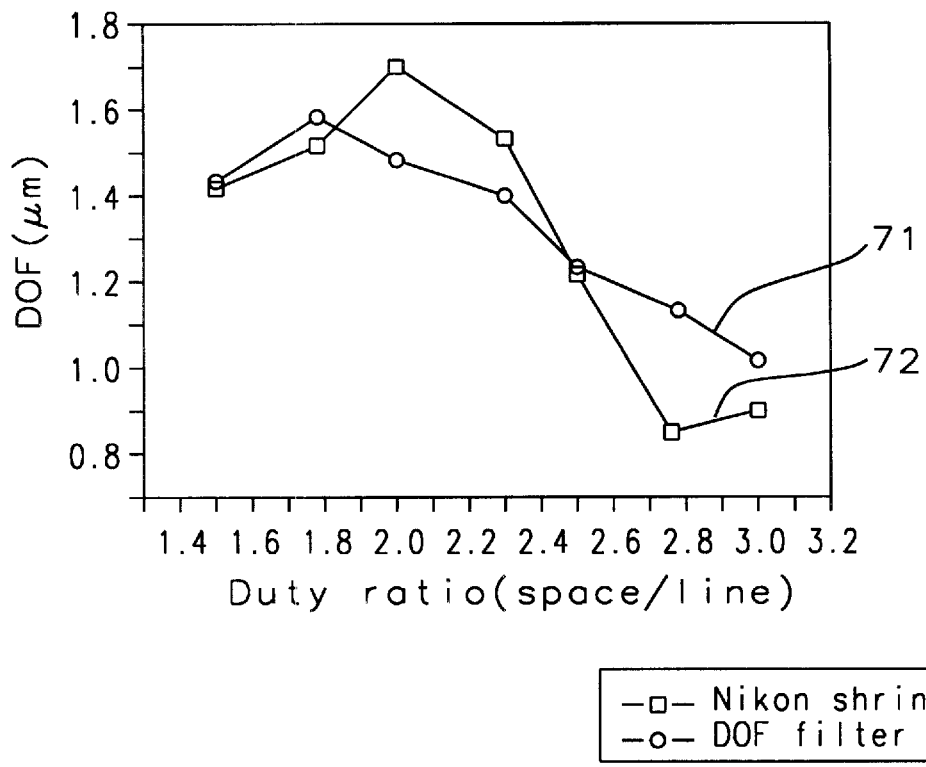
FIG. 7 compares DOF for a shrinc filter with that obtained by the method of the present invention.
Figure 8:
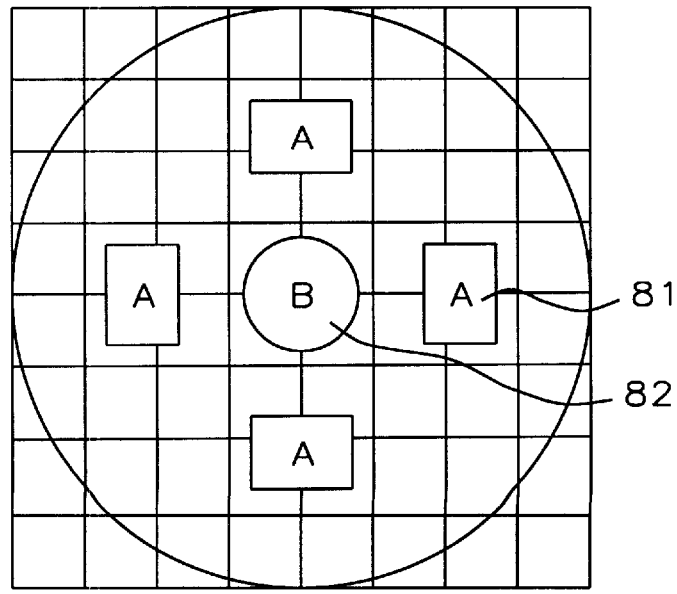
FIG. 8 is an aperture based on the data seen in FIG. 5.
Figure 9:
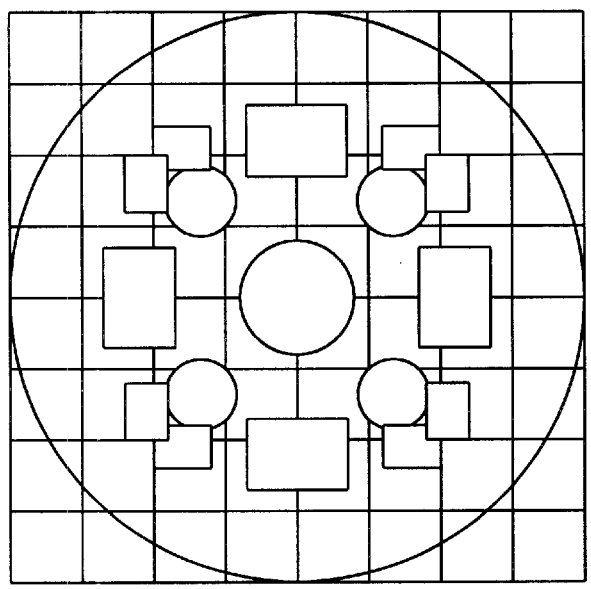
FIG. 9 illustrates the final filter design obtained by superimposing the designs shown in FIGS. 6 and 8.
Figure 10:
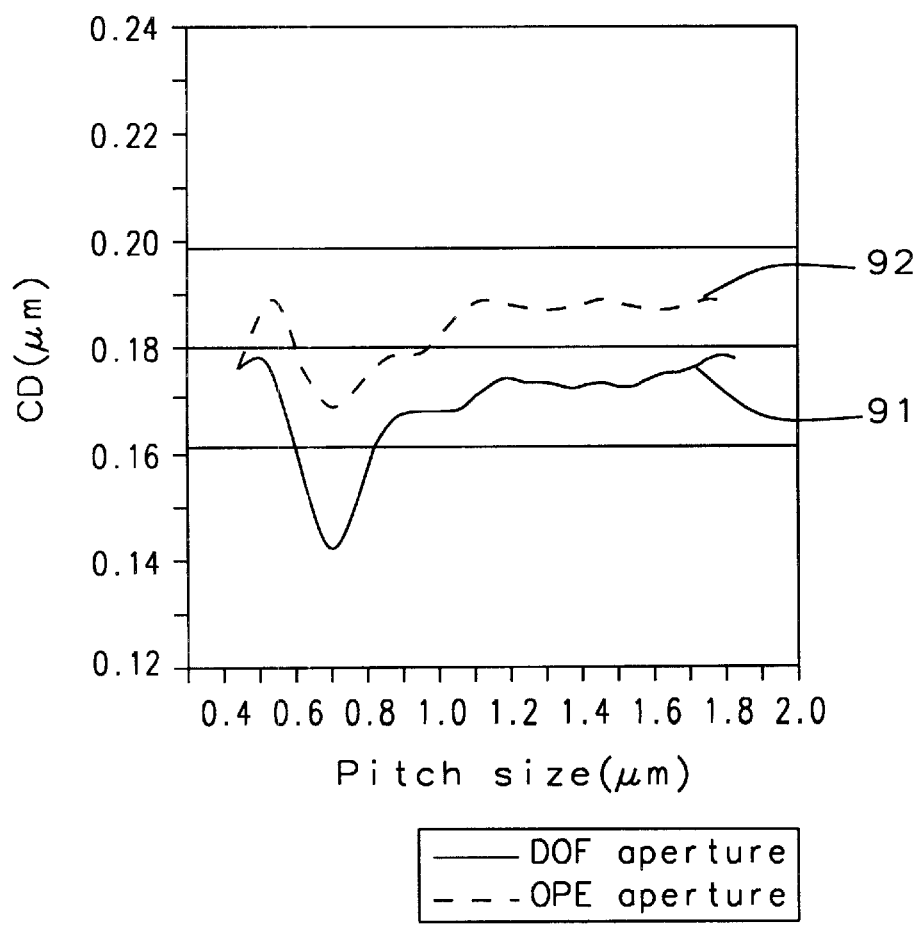
FIG. 10 compares CD obtained with a filter designed according to the prior art with a filter designed according to the method of the present invention over a wide range of duty ratios.

FIG. 9 shows the final filter design which is a superposition of the designs shown in FIGS. 6 and 8. The effectiveness of this approach is confirmed by the data shown in FIGS. 7 and 10. In FIG. 7, DOF over a wide range of duty ratio is compared for the commercially available shrinc filter (curve 72) and the design of FIG. 9 (curve 71) while FIG. 10 compares the CD over a range of pitch sizes (equivalent to duty ratio) for the filter of FIG. 6, which was optimized for DOF only, (curve 91) with the filter of FIG. 9 (optimized for both CD and DOF) (curve 92).

Use of the term "larger CD" in this context needs to be to explained. The aim of the process is to correct the optical proximity effect (OPE) that prints the large CD deviation seen in FIG. 10. In that figure, there are two curves and three straight lines. The three straight lines denote the 0.198, 0.18 and 0.162 micron CD from upper to lower, respectively. The 0.198 and 0.162 micron correspond to the upper and lower specifications for the 0.18 micron photolithography process. For the original aperture design, the aperture in FIG. 6, the OPE is very strong, although it has a larger DOF. The solid curve in FIG. 10 shows this large proximity effect, where the pitch size of about 0.6 to 0.8 microns falls below the CD spec. Thus, to compensate for this large proximity effect we have to increase the CD in this pitch range (approx. duty ratio 1:3 for the 0.18 microns). Hence, we collect the beams that could make the CD larger (for a 1:3 duty ratio) according to the contour map in FIG. 5.

While the invention has been particularly shown and described with reference to the preferred embodiments thereof, it will be understood by those skilled in the art that various changes in form and details may be made without departing from the spirit and scope of the invention.

What is claimed is:

1. A method of illumination aperture filter design, comprising:
   generating, through simulation, a first illumination aperture filter design that is optimized only for depth of focus;
   generating, through simulation, a second illumination aperture filter design that is optimized only for proximity effects; and
   superimposing the first design on the second design, thereby generating a third illumination aperture filter design that is optimized for both depth of focus and proximity effects.

2. The method of claim 1 wherein said third illumination aperture filter design is effective over a duty ratio that is about 1:N, where N≧1.

3. The method of claim 1 wherein said third illumination aperture filter design has four identical quadrants and is effective for illuminating wavelengths between about 90 and 365 nm.

4. The method of claim 1 further comprising generating said first and second designs by combining square and circular apertures.

5. A method of illumination aperture filter design, comprising:
   generating, through simulation, a first illumination aperture filter design that is optimized only for depth of focus;
   generating, through experimentation, a second illumination aperture filter design that is optimized only for proximity effects; and
   superimposing the first design on the second design, thereby generating a third illumination aperture filter design that is optimized for both depth of focus and proximity effects.

6. The method of claim 5 wherein said third illumination aperture filter design is effective over a duty ratio that is about 1:N, where N≧1.

7. The method of claim 5 wherein said third illumination aperture filter design has four identical quadrants and is effective for illuminating wavelengths between about 90 and 365 nm.

8. The method of claim 5 further comprising generating said first and second designs by combining square and circular apertures.

9. A method of illumination aperture filter design, comprising:
   generating, through experimentation, a first illumination aperture filter design that is optimized only for depth of focus;
   generating, through simulation, a second illumination aperture filter design that is optimized only for proximity effects; and
   superimposing the first design on the second design, thereby generating a third illumination aperture filter design that is optimized for both depth of focus and proximity effects.

10. The method of claim 9 wherein said third illumination aperture filter design is effective over a duty ratio that is about 1:N, where N≧1.

11. The method of claim 9 wherein said third illumination aperture filter design has four identical quadrants and is effective for illuminating wavelengths between about 90 and 365 nm.

12. The method of claim 9 further comprising generating said first and second designs by combining square and circular apertures.

13. A method of illumination aperture filter design, comprising:
   generating, through experimentation, a first illumination aperture filter design that is optimized only for depth of focus;
   generating, through experimentation, a second illumination aperture filter design that is optimized only for proximity effects; and
   superimposing the first design on the second design, thereby generating a third illumination aperture filter design that is optimized for both depth of focus and proximity effects.

14. The method of claim 13 wherein said third illumination aperture filter design is effective over a duty ratio that is about 1:N, where N≧1.

15. The method of claim 13 wherein said third illumination aperture filter design has four identical quadrants and is effective for illuminating wavelengths between about 90 and 365 nm.

16. The method of claim 13 further comprising generating said first and second designs by combining square and circular apertures.

17. An illumination aperture filter, comprising:
   a first part, that is optimized only for depth of focus; and
   a second part optimized only for proximity effects.

18. The illumination filter described in claim 17 wherein said first part further comprises an assemblage of square and circular apertures.

19. The illumination filter described in claim 17 wherein said second part further comprises an assemblage of square and circular apertures.

20. The illumination filter described in claim 17 wherein the filter has a diameter between about 1 and 50 cm and further comprises four identical quadrants.

* * * * *